United States Patent
Chiu et al.

(10) Patent No.: US 10,062,751 B2
(45) Date of Patent: Aug. 28, 2018

(54) SEMICONDUCTOR DEVICE

(71) Applicant: UNITED MICROELECTRONICS CORP., Hsin-Chu (TW)

(72) Inventors: Hou-Jen Chiu, Taichung (TW); Ya-Ting Lin, Hsinchu (TW); Mei-Ling Chao, Tainan (TW); Tien-Hao Tang, Hsinchu (TW); Kuan-Cheng Su, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/402,204

(22) Filed: Jan. 9, 2017

(65) Prior Publication Data
US 2018/0158902 A1    Jun. 7, 2018

(30) Foreign Application Priority Data
Dec. 5, 2016    (TW) .............................. 105140044 A

(51) Int. Cl.
| | | |
|---|---|---|
| *H01L 27/088* | (2006.01) | |
| *H01L 29/06* | (2006.01) | |
| *H01L 29/78* | (2006.01) | |

(52) U.S. Cl.
CPC ...... *H01L 29/0638* (2013.01); *H01L 29/0653* (2013.01); *H01L 29/7851* (2013.01)

(58) Field of Classification Search
CPC ............. H01L 29/0638; H01L 29/0653; H01L 29/7851; H01L 21/7602; H01L 21/76291; H01L 27/10823
See application file for complete search history.

(56) References Cited

U.S. PATENT DOCUMENTS

| | | | |
|---|---|---|---|
| 8,643,101 B2 | 2/2014 | Kao | |
| 8,916,460 B1* | 12/2014 | Kwon | ................... H01L 21/845 257/192 |
| 9,368,496 B1* | 6/2016 | Yu | ........................ H01L 27/0886 |
| 2017/0194436 A1* | 7/2017 | Basker | ............ H01L 21/823431 |

* cited by examiner

*Primary Examiner* — Cuong B Nguyen
(74) *Attorney, Agent, or Firm* — Winston Hsu

(57) ABSTRACT

A semiconductor device comprises a fin shaped structure, a shallow trench isolation, a diffusion break structure and a gate electrode. The fin shaped structure is disposed on a substrate. The shallow trench isolation is disposed in the substrate and surrounds the fin shaped structure. The diffusion break structure is disposed in the fin shaped structure, and the gate electrode is disposed across the fin shaped structure.

13 Claims, 7 Drawing Sheets

SEMICONDUCTOR DEVICE

BACKGROUND OF THE INVENTION

1. Field of the Invention

The present invention relates to a semiconductor device, particularly to a semiconductor device including a diffusion break structure.

2. Description of the Prior Art

In recent years, as the size of the field effect transistors continuously to be shrunk, the development of the conventional planar field effect transistors has reached a processing limit. In order to overcome the processing limit, non-planar field effect transistor, such as fin field effect transistor (Fin FET) has become the main development trend to replace the planar field effect transistor and. Since the three-dimensional structure of the fin field effect transistor increases the contact area between the gate electrode and the fin shaped structure, the gate electrode may better control the channel region, so as to mitigate the drain induced barrier lowering (DIBL) effect resulted from shrinking the size of the device and restrain the short channel effect (SCE).

However, based on the current processes of fin field effect transistor, there are still many problems for the design of fin shaped structure, which may influence the leakage current and performance of the entire device. Hence, it is an important issue to improve the current processes of fin field transistor.

SUMMARY OF THE INVENTION

One of the objectives of the present invention is to provide a semiconductor device, wherein a diffusion break structure is disposed under the gate electrode and adjacent to the source electrode and/or the drain electrode to mitigate current crowding and improve electrostatic discharge performance.

For the above purposes, an embodiment of the present invention provides a semiconductor device including a fin shaped structure, a shallow trench isolation, a diffusion break structure and a gate electrode. The fin shaped structure is disposed on a substrate. The shallow trench isolation is disposed in the substrate and surrounds the fin shaped structure. The diffusion break structure is disposed in the fin shaped structure, and the gate electrode extends across the fin shaped structure.

In the semiconductor device of the present invention, a diffusion break structure is additionally disposed in the channel region of a transistor, wherein the diffusion break structure, for example, can be disposed at anode, both anode side and cathode side, between anode side and cathode side and so on of the transistor. The diffusion break structure is formed in a trench of the fin shaped structure and includes either same or different insulation materials compared to the shallow trench isolation, wherein the sidewall of the trench is preferably covered by two different films, such as covered by a silicon oxide layer and a silicon nitride layer, but not limited thereto. Thereby, when there is an electric current applied to the semiconductor device of the present invention, the electric current may be guided to flow in a deeper path, so as to mitigate the current crowding and have a better electrostatic discharge performance.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous embodiments with specific details and schematic diagrams are given to provide those skilled in the art a thorough understanding of the present invention, including the concept and the effect of the present invention.

Figure 1:
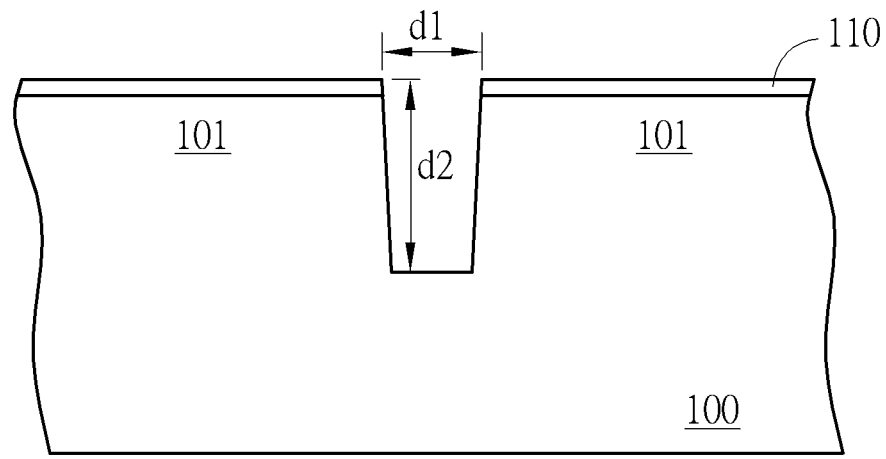
FIGS. 1-6 are schematic diagrams illustrating a cross-sectional view of steps of a method of forming a semiconductor device in the first embodiment of the present invention.
Figure 3:
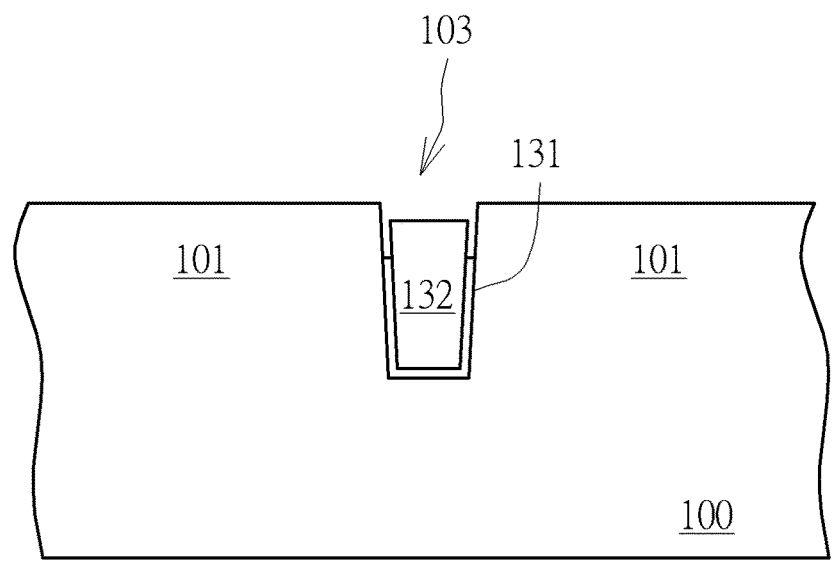
Figure 4:
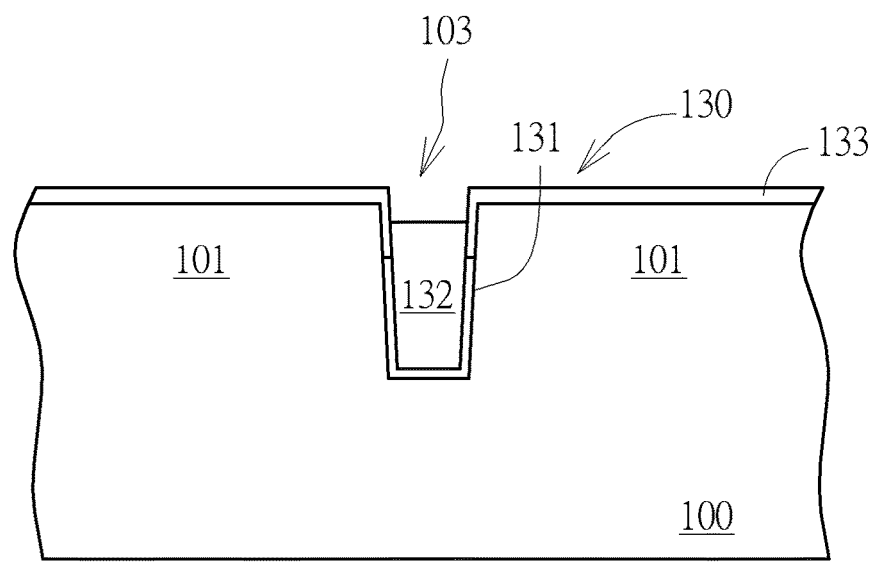
Figure 5:
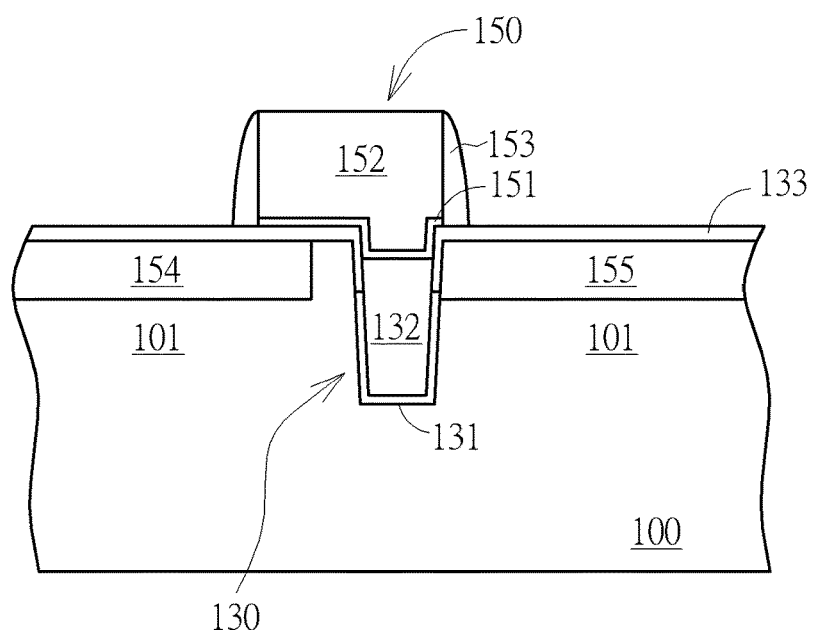
Figure 6:
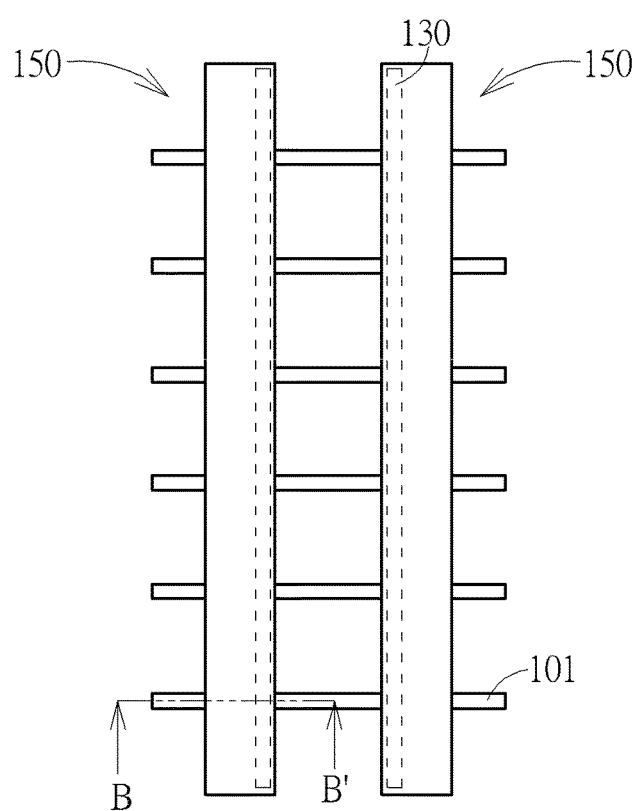

Referring to FIG. 1 to FIG. 6, FIGS. 1-6 are schematic diagrams illustrating the processes of a method of forming a semiconductor device according to a first embodiment of the present invention, wherein FIG. 6 is a top view of the semiconductor device and FIG. 5 is a cross-sectional view taken along a cross-sectional line B-B' of FIG. 6. First, as shown in FIG. 1, a substrate 100 is provided. The substrate 100 may be a semiconductor substrate such as a silicon substrate, a silicon-containing substrate, a silicon-on-insulator (SOI) and the like. At least a fin shaped structure 101 is formed on the substrate 100. In the embodiment including bulk silicon process, the fin shaped structure 101 is formed preferably by sidewall image transfer (SIT) technique, which includes forming a plurality of patterned sacrificial layers through a photolithography-etching process (PEP), sequentially performing a deposition process and an etching process so as to form spacers on the sidewalls of the patterned sacrificial layers (not illustrated), followed by removing the patterned sacrificial layers, and performing an etching process with the spacers covered so as to transfer the pattern of the spacers to a patterned mask with single-layer structure or multilayer structure, such as a silicon oxide layer 110 and a silicon nitride layer (not illustrated) disposed thereon. Then, an etching process is further performed to transfer the pattern of the patterned mask to the substrate 100 thereunder. Therefore, a plurality of shallow trenches (not illustrated) is formed and the fin shaped structure 101 is defined at the same time.

After that, an insulation layer is formed in the shallow trenches by performing a flowable chemical vapor deposition (FCVD) process. Then a chemical mechanical polishing (CMP) process accompanied with an etching-back process is performed so that the remaining insulation layer is left in the shallow trenches. The insulation layer may include silicon monoxide material as an example. Therefore, the upper portion of the fin shaped structure 101 is protrudent from the surface of the insulation layer, and the insulation layer in the trenches forms the shallow trench isolation (STI) 102. Furthermore, the shallow trench isolation 102 surrounds the fin shaped structure 101. In this embodiment, while performing the chemical mechanical polishing and etching-back processes, the silicon nitride layer of the patterned mask may be selectively removed to retain only the silicon oxide layer 110 positioned under the silicon nitride layer, as shown in FIG. 1.

And then, a portion of the fin shaped structure 101 is removed to form at least one trench 103 in the substrate 100. To be more precise, the forming method of the trench 103 is, for example, performing a sawing process for fin shaped structure by using a patterned mask again, so as to sequentially transfer the pattern of the patterned mask to the silicon oxide layer 110 and the substrate 100 positioned below to form the trench 103. The trench 103 has a dimension d1 smaller than the shallow trench insolation. In another aspect, the depth d2 of the trench 103 may be smaller than or equal to the shallow trench isolation 102.

Figure 2:
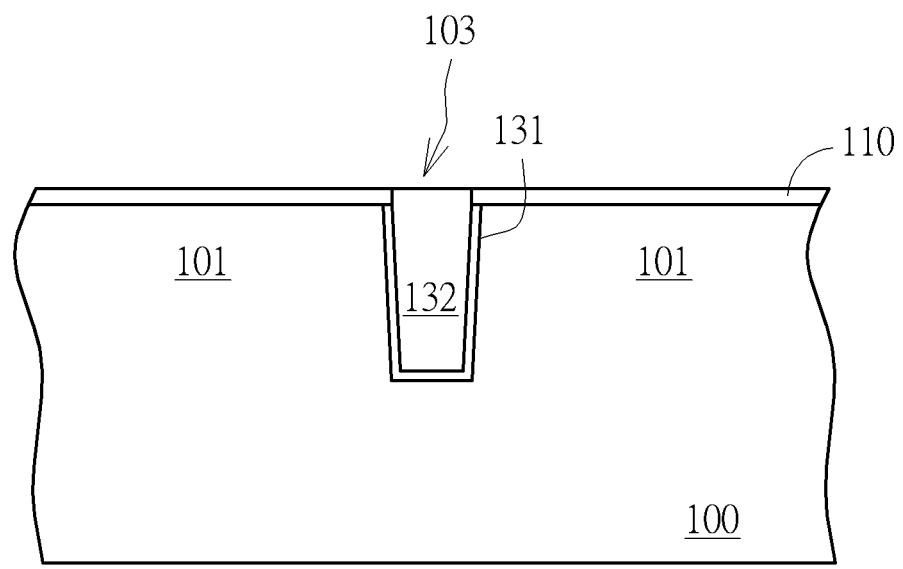

Then, a dielectric layer 131 covering the sidewall of the trench 103 and an insulation layer 132 filling up the trench 103 are sequentially formed, as shown in FIG. 2. The forming method of the dielectric layer 131 and the insulation layer 132 may include, for example, blanketly forming a dielectric material layer (not illustrated), and forming an insulation material layer (not illustrated), followed by performing a chemical polishing process and an etching-back process by taking the silicon oxide layer 110 as the etching stop layer. The formed dielectric layer 131 in the trench 103 serves as a liner. Therefore, the top surface of the insulation layer 132 is just leveled with the silicon oxide layer 110. In this embodiment, the insulation layer is preferably made of insulation materials which has an etch selectivity compared to the material of the dielectric layer. For example, the dielectric layer 131 may include silicon nitride and the insulation layer 132 may include silicon nitride or other insulation materials different from the shallow trench isolation 102 such as silicon nitride or the like.

After that, an etching process is performed to remove the silicon oxide layer 110, a portion of the dielectric layer 131 and a portion of the insulation layer 132 to expose a top surface of the fin shaped structure 101, and the sidewall of the upper part of the trench 103 is also exposed by the dielectric layer 131. More precisely, the etching process, for example, is a wet etching process removing the dielectric layer 131 and the insulation layer 132 by an etchant which has high etching selectivity ratio to silicon nitride. Therefore, after the etching process, the portion of the insulation layer 132 being removed is comparatively less than the portion of the dielectric layer 131 being removed, so the insulation layer 132 can have a top surface higher than the dielectric layer 131, as shown in FIG. 3.

After the etching process, a silicon oxide layer 133 is formed on the top surface of the fin shaped structure 101 and the sidewall of the upper part of the trench 103. The forming method of the silicon oxide 133, for example, may include performing an in situ steam generation (ISSG) process to make the silicon oxide layer 133 distribute uniformly on both the top surface of the fin shaped structure 101 and the exposed surface of the trench 103, as shown in FIG. 4. Therefore, the dielectric layer 131, the insulation layer 132 and the silicon oxide layer 133 disposed in the trench 103 may together form a diffusion break structure 130, which is disposed in the fin shaped structure 101. Besides, it should be noted that the silicon oxide layer 133 filled in the trench 103 preferably has the same thickness as the underneath dielectric layer 131 in this embodiment. In other words, the upper part and the lower part of the trench 103 are covered by the silicon oxide layer 133 and the dielectric layer 131 that have the same thickness but different materials respectively, as shown in FIG. 4. Furthermore, the dielectric layer 131 and the silicon oxide layer 133 which cover the sidewall of the trench 103 are connected to each other, wherein the connection point is lower than the top surface of the insulation layer 132. However, in other embodiments of the present invention, the dielectric layer 131 and the silicon oxide 133 may have the same materials, or the connection point of the dielectric 131 and the silicon oxide layer 133 (not illustrated) may be higher than the top surface of the insulation layer 132.

Next, a doped well (not illustrated) may be formed in the fin shaped structure 101, followed by forming a source electrode 154 and a drain electrode 155 respectively in the doped well at different sides of the diffusion break structure 130 and forming agate electrode 150 which extends across the fin shaped structure 101. More precisely, for forming an n-type transistor as an example, the method of forming the source electrode 154, the drain electrode 155 and the gate electrode 150 may include first forming a p-type doped well (not illustrated), forming a mask (not illustrated) on the fin shaped structure 101 to define the positions of the n-type source electrode 154 and the drain electrode 155 to be formed, and then sequentially performing an etching process, an selectively epitaxial growth process and an in-situ doping process to form the source electrode 154 and the drain electrode 155, as shown in FIG. 5. The drain electrode 155 is formed in contact with or adjoining to the diffusion break structure 130 and the source electrode 154 is disposed separately from the diffusion break structure 130 such that a portion of the fin shaped structure 101 is disposed between the source electrode 154 and the diffusion break structure 130, as shown in FIG. 5. In another embodiment, the source electrode 154 and the drain electrode 155 may be formed by performing an ion implantation process right after forming the mask.

In this embodiment, the doping process of the source electrode 154 and the drain electrode 155 is performed before forming the gate electrode 150. The gate electrode 150 is disposed between the source electrode 154 and the drain electrode 155 and further extends across and above the diffusion break structure 130, a portion of the fin shaped structure 101 that is positioned between the source electrode 154 and the diffusion break structure 130, and a portion of the source electrode 154. The gate electrode 150 includes a gate dielectric layer 151 including insulation material such as silicon oxide or the like, a gate layer 152 including the material of polysilicon or metal for example, and a spacer 153 that surrounds the gate layer 152 and the gate dielectric layer 151. Wherein, the gate electrode 150 covers the entire diffusion break structure 130, and a portion of the electrode layer 152 and a portion of the gate dielectric layer 151 extend downward into the trench 103. Preferably, the gate dielectric layer 151 is directly in contact with the silicon oxide layer 133 and the insulation layer 132 in the trench 103 but not in contact with the dielectric layer 131, as shown in FIG. 5, but not limited thereto. Furthermore, the forming method of the source electrode 154 and the drain electrode 155 are not limited to the above mentioned processes. In another embodiment, the gate electrode 150 may be formed first and then the locations of the source electrode and the drain electrode may be directly defined by the gate electrode 150. Accordingly, the drain electrode 155 and the source electrode 154 that partly overlap the gate electrode 150 shown in FIG. 5 may still be formed by controlling the etching process parameter or performing a tilted ion implantation process.

Therefore, the semiconductor device according to the first embodiment of the present invention is completed. In the following, a process for forming contact etch stop layer (CESL), a replacement-metal-gate (RMG) process or other processes may be further performed to fabricate a more complete transistor structure. These processes may refer to the prior arts for manufacturing a transistor, so they will not be detailed redundantly.

Referring to FIG. 6, a top view of the semiconductor device of this embodiment is illustrated. In this embodiment, the semiconductor device includes two gate electrodes 150 which are disposed in parallel and share the same drain electrode 155, while FIG. 1 to FIG. 5 mentioned above for explaining the fabrication processes are all cross-sectional views taken along the cross-sectional line B-B' of FIG. 6. However, the semiconductor device in the present invention is not limited to including two gate electrodes 150. In another embodiment, the semiconductor device (not illustrated) may have only one gate electrode 150. According to this embodiment, the gate electrode 150, the source electrode 154 and the drain electrode 155 may together form an n-type transistor. A diffusion break structure 130 is disposed at a side of the anode (i.e. the drain electrode 155) of the n-type transistor close to the channel region. Therefore, when applying a voltage to the n-type transistor, the current path may be affected by the diffusion break structure 130 such that the current may flow deeper, hence the current crowding can be mitigated. Meanwhile, disposing the diffusion break structure 130 in the semiconductor device of the present invention further provides a better electrostatic discharge performance. For example, the human body model (HBM) test may reach around 2 kV, and the machine model (MM) test may reach around 100 V, but not limited thereto.

Those skilled in the art should easily understand that the semiconductor device of the present invention may also be formed by other methods and is not limited to the above-mentioned steps. For example, in another embodiment when forming a p-type transistor (not illustrated), one could form the diffusion break structure in the channel region of the p-type transistor (not illustrated) by referring to the above mentioned fabrication processes. Furthermore, the following context is going to further illustrate the semiconductor devices and related formation methods of other embodiments or variations of the present invention. To simplify the description, the following context only details the dissimilarities among different embodiments, and the identical features will not be redundantly described. Besides, the identical components in each embodiment of the present invention are given the same symbols in order to make clear comparisons.

Figure 7:
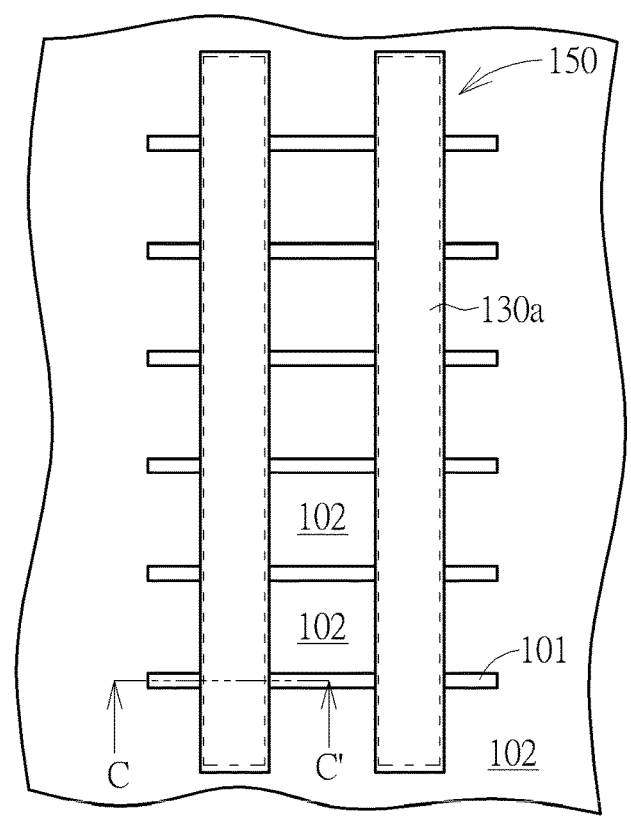
FIGS. 7-8 are schematic diagrams illustrating a semiconductor device in the second embodiment of the present invention.
Figure 8:
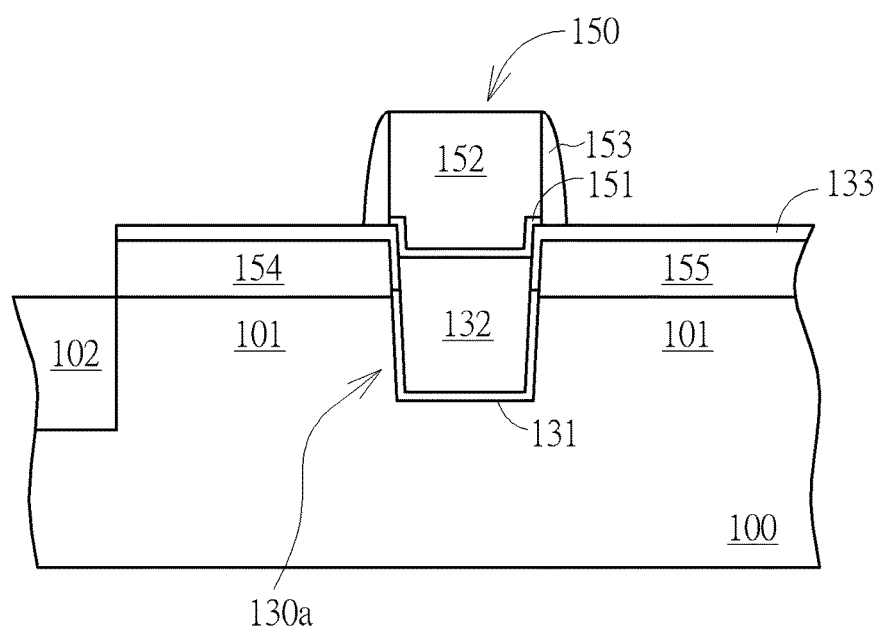

Referring to FIG. 7 and FIG. 8, the second embodiment of the semiconductor device of the present invention is illustrated, wherein FIG. 7 is a top view of the semiconductor device and FIG. 8 is a cross-sectional view taken along the cross-sectional line C-C' of FIG. 7. The semiconductor device in this embodiment is roughly similar to the above-mentioned first embodiment, which includes a diffusion break structure 130a formed in the fin shaped structure 101 and two gate electrodes 150 extending across the fin shaped structure 101.

As shown in FIG. 7 and FIG. 8, the main difference between this embodiment and the above-mentioned first embodiment is that the diffusion break structure 130a extends between the source electrode 154 and the drain electrode 155. That is to say, the diffusion break structure 130a in this embodiment has a bigger size, which is preferably the same as the size of the gate layer 152 of the gate electrode 150, such that the gate layer 152 completely overlaps the diffusion break structure 130a therebelow. In other words, the gate electrode 150 (the gate layer 152) of this embodiment is only disposed between the source electrode 154 and the drain electrode 155 and does not overlap the source electrode 154 and the drain electrode 155, as shown in FIG. 8. Therefore, the gate electrode 150 of this embodiment may serve as a dummy gate electrode or be grounded to make the semiconductor device have a better insulation effect and better electrostatic discharge performance. For example, the human body model test may reach around 2 kV, and the machine model test may reach around 100 V, but not limited thereto.

Figure 9:
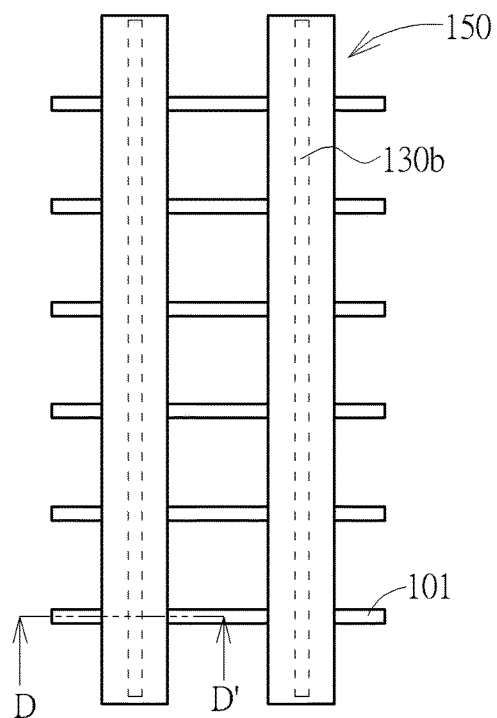
FIGS. 9-10 are schematic diagrams illustrating a semiconductor device in the third embodiment of the present invention.
Figure 10:
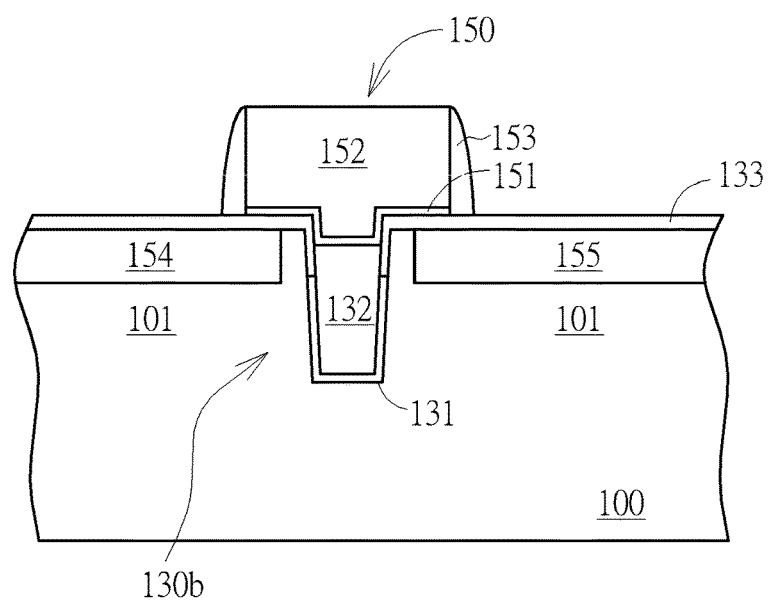

Referring to FIG. 9 and FIG. 10, the third embodiment of the semiconductor device of the present invention is illustrated, wherein FIG. 9 is a top view of the semiconductor device and FIG. 10 is a cross-sectional view taken along the cross-sectional line D-D' of FIG. 9. The semiconductor device in this embodiment is roughly similar to the above-mentioned first embodiment, which includes a diffusion break structure 130b formed in the fin shaped structure 101 and two gate electrodes 150 extending across the fin shaped structure 101.

As shown in FIG. 9 and FIG. 10, the main difference between this embodiment and the above-mentioned first embodiment is that the diffusion break structure 130b is not adjoining to the source electrode 154 nor the drain electrode 155 although it is still positioned between the source electrode 154 and the drain electrode 155, as shown in FIG. 9. Therefore, when applying a voltage to the n-type transistor of this embodiment, the current path may be affected by the diffusion break structure 130b and formed deeper, hence the current crowding can be mitigated. Meanwhile, the semiconductor device in this embodiment of the present invention may also have a better electrostatic discharge performance. For example, the human body model test may reach around 2 kV, and the machine model test may reach around 100 V, but not limited thereto.

Figure 11:
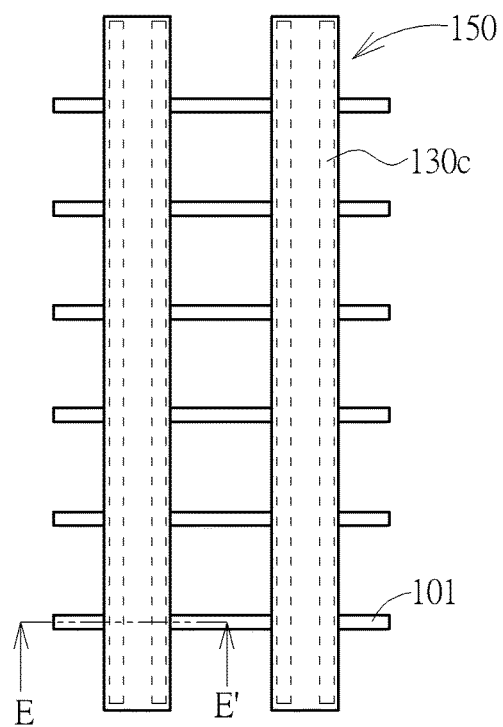
FIGS. 11-12 are schematic diagrams illustrating a semiconductor device in the fourth embodiment of the present invention.
Figure 12:
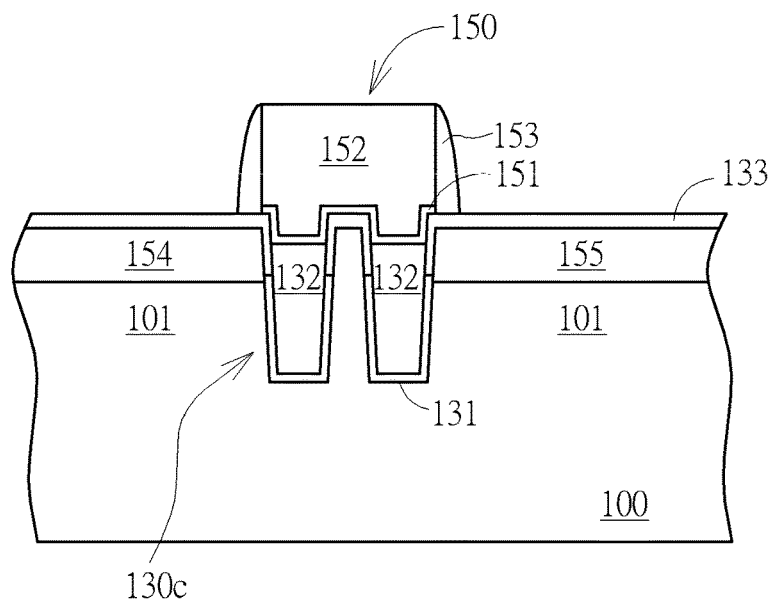

Referring to FIG. 11 and FIG. 12, the semiconductor device of the fourth embodiment of this invention is illustrated, wherein FIG. 11 is a top view of the semiconductor device and FIG. 12 is a cross-sectional view taken along the cross-sectional line E-E' of FIG. 12. The semiconductor device in this embodiment is roughly similar to the above-mentioned first embodiment, which includes a diffusion break structure 130c formed in the fin shaped structure 101 and two gate electrodes 150 extending across the fin shaped structure 101.

As shown in FIG. 11 and FIG. 12, the main difference between this embodiment and the above-mentioned first embodiment is that the diffusion break structure 130c includes two portions, wherein the two portions are respectively disposed at the positions adjoining to the source electrode 154 and adjoining to the drain electrode 155. That is to say, the diffusion break structure 130c is disposed both at the side of the anode (the drain electrode 155) of the n-type transistor which is close to the channel region and at the side of the cathode (the source electrode 154) of the n-type transistor close to the channel region, as shown in FIG. 11. Furthermore, in this embodiment, the two portions of the diffusion break structure 130c may have the same depths, as shown in FIG. 12, but not limited thereto. In another embodiment, the two portions of the diffusion break structure 130c may have different depths, in which the depth of the portion of the diffusion break structure 130c adjoining to the source electrode 154 may be greater than or less than the depth of the portion of the diffusion break structure 130c adjoining to the drain electrode 155.

Therefore, when applying a voltage to the n-type transistor of this embodiment, the current path may still be affected by the diffusion break structure 130c and formed deeper, and thus the current crowding can be mitigated. Meanwhile, the semiconductor device of the present invention may have a better electrostatic discharge performance. For example, the human body model test may reach around 2 kV, and the machine model test may reach around 100 V, but not limited thereto.

Figure 13:
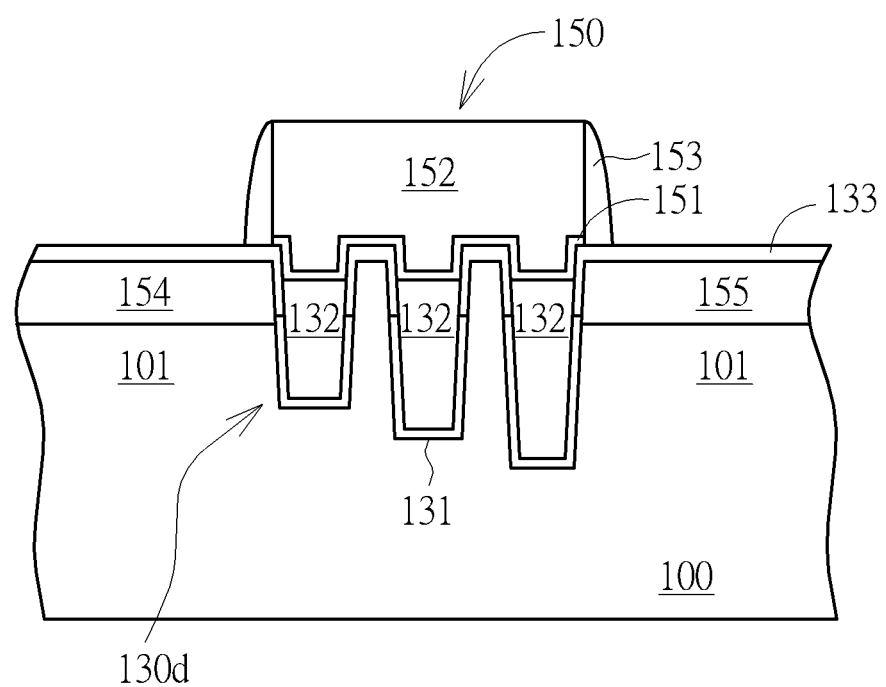
FIG. 13 is a schematic diagram illustrating a semiconductor device in the fifth embodiment of the present invention.

Referring to FIG. 13, the fifth embodiment of the semiconductor device of the present invention is illustrated. The semiconductor device in this embodiment is roughly the similar to the above-mentioned fourth embodiment, which includes a diffusion break structure 130d formed in the fin shaped structure 101 and at least one gate electrode 150 extending across the fin shaped structure 101.

The main difference between this embodiment and the above-mentioned embodiments is that the diffusion break structure 130d includes a plurality of portions, wherein the portions are respectively disposed at the position adjoining to the source electrode 154, at the position adjoining to the drain electrode 155, and at the position between the source electrode 154 and the drain electrode 155. In addition, each portion of the diffusion break structure 130d may have a different depth independently. For example, the diffusion break structure 130d in this embodiment may have three portions, as shown in FIG. 13. Wherein, one of the three portions is disposed at a side of the anode (the drain electrode 155) of the n-type transistor close to the channel region, another one of the three portions of the diffusion break structure 130d is disposed at a side of the cathode (the source electrode 154) of the n-type transistor close to the channel region, and the other one of the three portions is disposed between the above two portions. Furthermore, the depth of one portion of the diffusion break structure 130d is preferably greater than the depth of another portion that is closer to the source electrode 154, as shown in FIG. 13, but not limited thereto. In another embodiment, the depth of one portion of the diffusion break structure 130d may be preferably greater than the depth of another portion that is closer to the drain electrode 155.

Therefore, when applying a voltage to the n-type transistor of this embodiment, the current path may still be affected by the diffusion break structure 130d. Furthermore, a more complex current path may be formed deeper, and thus the current crowding can be further mitigated. Meanwhile, the semiconductor device of the present invention may have a better electrostatic discharge performance. For example, the human body model test may reach around 2 kV, and the machine model test may reach around 100 V, but not limited thereto.

According to the above disclosure, for the semiconductor device of the present invention, a diffusion break structure is additionally disposed in the channel region of a transistor. For example, the diffusion break structure can be disposed at the anode side or at both the anode side and the cathode side, or disposed between the anode and the cathode. The diffusion break structure is formed in a trench of the fin shaped structure and includes either the same or different insulation materials compared to the shallow trench isolation, wherein the sidewall of the trench is preferably to be covered by two different films, such as silicon oxide layer and silicon nitride layer, but not limited thereto. Thereby, when the semiconductor device of the present invention is conducted, the electric current may be guided to flow in a deeper current path, thus the current crowding is mitigated and a better electrostatic discharge performance is obtained. Besides, the present invention is not limited to the above embodiments, all of which introduce the structure of the semiconductor device having n-type transistors for illustration, and the diffusion break structure of the present invention could also be applied to the semiconductor device having p-type transistors.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a fin shaped structure disposed on a substrate;
   a shallow trench isolation disposed in the substrate and surrounding the fin shaped structure;
   a diffusion break structure disposed in the fin shaped structure, wherein the diffusion break structure comprises:
   a trench within the fin shape structure;
   an insulating layer filling only part of the trench;
   a dielectric layer covering a sidewall of a lower part of the trench;
   a silicon oxide layer covering a sidewall of an upper part of the trench, wherein the silicon oxide layer and the dielectric layer are different materials; and
   a gate electrode extending across the fin shaped structure, wherein the gate electrode fills in the trench and the gate electrode includes a gate layer and a gate dielectric layer that is in contact with the diffusion break structure.

2. The semiconductor device according to claim 1, further comprising:
   a doped well disposed in the fin shaped structure; and
   a source electrode and a drain electrode disposed in the doped well and at two different sides of the gate respectively.

3. The semiconductor device according to claim 2, wherein the diffusion break structure extends between the source electrode and the drain electrode.

4. The semiconductor device according to claim 1, wherein the diffusion break structure overlaps a portion of the gate electrode.

5. The semiconductor device according to claim 4, wherein the diffusion break structure is adjoining to the drain electrode.

6. The semiconductor device according to claim 4, wherein the diffusion break structure is disposed between the source electrode and the drain electrode.

7. The semiconductor device according to claim 4, wherein the diffusion break structure includes two portions, one of the two portions is adjoining to the source electrode and another one of the two portions is adjoining to the drain electrode.

8. The semiconductor device according to claim 1, wherein the diffusion break structure has a depth smaller than a depth of the shallow trench isolation.

9. The semiconductor device according to claim 1, wherein the diffusion break structure has a depth equal to a depth of the shallow trench isolation.

10. The semiconductor device according to claim 1, wherein the diffusion break structure and the shallow trench isolation include different materials.

11. The semiconductor device according to claim 1, wherein the diffusion break structure and the shallow trench isolation include same materials.

12. The semiconductor device according to claim 1, wherein the insulation layer includes silicon oxide or silicon nitride.

13. The semiconductor device according to claim 4, wherein the diffusion break structure includes a plurality of portions, one of the plurality of portions is adjoining to the source electrode, another one of the plurality of portions is adjoining to the drain electrode, and the other one of the plurality of portions is positioned between the source electrode and the drain electrode but separate from the source electrode and the drain electrode.

* * * * *